United States Patent
Horan et al.

(10) Patent No.: US 12,267,071 B2
(45) Date of Patent: Apr. 1, 2025

(54) DESATURATION CIRCUIT HAVING TEMPERATURE COMPENSATION

(71) Applicant: Allegro MicroSystems, LLC, Manchester, NH (US)

(72) Inventors: John Horan, Cork (IE); Paddy Collins, Cork (IE)

(73) Assignee: Allegro MicroSystems, LLC, Manchester, NH (US)

( * ) Notice: Subject to any disclaimer, the term of this patent is extended or adjusted under 35 U.S.C. 154(b) by 90 days.

(21) Appl. No.: 18/327,292

(22) Filed: Jun. 1, 2023

(65) Prior Publication Data

US 2024/0405756 A1    Dec. 5, 2024

(51) Int. Cl.
| H03K 3/011 | (2006.01) |
| H03K 17/687 | (2006.01) |

(52) U.S. Cl.
CPC .......... *H03K 3/011* (2013.01); *H03K 17/687* (2013.01)

(58) Field of Classification Search
None
See application file for complete search history.

(56) References Cited

U.S. PATENT DOCUMENTS

| 4,461,966 A | 7/1984 | Hebenstreit |
| 4,748,351 A | 5/1988 | Barzegar |
| 4,970,420 A | 11/1990 | Billings |
| 5,019,719 A | 5/1991 | King |
| 5,051,609 A | 9/1991 | Smith |
| 5,430,613 A | 7/1995 | Hastings et al. |
| 5,598,135 A | 1/1997 | Maeda et al. |
| 5,847,631 A | 12/1998 | Taylor et al. |
| 5,959,846 A | 9/1999 | Noguchi et al. |
| 6,107,860 A | 8/2000 | Vinciarelli |
| 6,181,130 B1 | 1/2001 | Hoshi et al. |
| 6,281,560 B1 | 8/2001 | Allen et al. |
| 6,356,161 B1 * | 3/2002 | Nolan ............... H03K 3/011 331/74 |
| 6,377,155 B1 | 4/2002 | Allen et al. |
| 6,775,901 B1 | 8/2004 | Lee et al. |
| 6,791,851 B2 | 9/2004 | Brkovic |
| 7,023,315 B2 | 4/2006 | Yeo et al. |

(Continued)

FOREIGN PATENT DOCUMENTS

| DE | 3700488 A1 | 7/1988 |
| DE | 10 2004 033 125 A1 | 2/2006 |

(Continued)

OTHER PUBLICATIONS

U.S. Appl. No. 17/659,385, filed Apr. 15, 2022, Messier et al.

(Continued)

*Primary Examiner* — Kenneth B Wells
(74) *Attorney, Agent, or Firm* — DALY, CROWLEY, MOFFORD & DURKEE, LLP

(57) ABSTRACT

Methods and apparatus for a desaturation circuit having a temperature compensated voltage threshold for protecting a power transistor, such as a FET. A comparator module has a first input compared to a voltage source associated with current through the FET and a second input coupled to the voltage threshold circuit. As a resistance of the FET changes due to temperature changes, the voltage threshold changes to compensate for the resistance change of the FET.

29 Claims, 5 Drawing Sheets

(56) References Cited

U.S. PATENT DOCUMENTS

| | | | |
|---|---|---|---|
| 7,119,448 | B1 | 10/2006 | de Stasi |
| 7,173,835 | B1 | 2/2007 | Yang |
| 7,663,351 | B2 | 2/2010 | Korsunsky |
| 7,719,112 | B2 | 5/2010 | Shen |
| 7,804,697 | B2 | 9/2010 | Melanson |
| 7,868,431 | B2 | 1/2011 | Feng et al. |
| 8,063,689 | B2 | 11/2011 | Theiler |
| 8,094,458 | B2 | 1/2012 | Furnival |
| 8,106,707 | B2 * | 1/2012 | Katyal .................. G05F 3/30 327/539 |
| 8,217,748 | B2 | 7/2012 | Feng et al. |
| 8,680,837 | B2 | 3/2014 | Zeng et al. |
| 8,736,343 | B2 | 5/2014 | Chen et al. |
| 8,816,666 | B2 | 8/2014 | Kimura et al. |
| 9,048,020 | B2 | 6/2015 | Calvillo Cortes et al. |
| 9,600,014 | B2 * | 3/2017 | Marinca ................ G05F 3/30 |
| 9,660,584 | B2 | 5/2017 | Modi et al. |
| 9,743,523 | B2 | 8/2017 | Huang et al. |
| 9,847,166 | B2 | 12/2017 | Kneller |
| 9,887,034 | B2 | 2/2018 | Francis |
| 9,898,029 | B2 * | 2/2018 | Rasmus ............... G05F 3/262 |
| 9,899,140 | B2 | 2/2018 | Kneller et al. |
| 9,922,764 | B2 | 3/2018 | Kneller et al. |
| 9,948,294 | B2 | 4/2018 | Peter et al. |
| 10,002,703 | B2 | 6/2018 | Wang et al. |
| 10,014,798 | B1 | 7/2018 | Vinciarelli |
| 10,062,495 | B2 | 8/2018 | Lloyd |
| 10,176,917 | B2 | 1/2019 | Parish et al. |
| 10,217,558 | B2 | 2/2019 | Kneller |
| 10,224,143 | B2 | 3/2019 | Kneller et al. |
| 10,229,779 | B2 | 3/2019 | Harber |
| 10,234,513 | B2 | 3/2019 | Vig et al. |
| 10,256,027 | B2 | 4/2019 | Li et al. |
| 10,319,509 | B2 | 6/2019 | Kneller et al. |
| 10,347,413 | B2 | 7/2019 | Francis |
| 10,573,457 | B2 | 2/2020 | Wang et al. |
| 10,811,181 | B2 | 10/2020 | Parish et al. |
| 10,930,422 | B2 | 2/2021 | Francis |
| 11,139,102 | B2 | 10/2021 | Kneller et al. |
| 11,201,619 | B2 | 12/2021 | Rinne et al. |
| 11,211,929 | B2 | 12/2021 | Rinne et al. |
| 11,282,631 | B2 | 3/2022 | Francis |
| 2007/0080740 | A1 * | 4/2007 | Berens .................. G05F 3/30 327/539 |
| 2009/0147544 | A1 | 6/2009 | Melanson |
| 2009/0237899 | A1 | 9/2009 | Furnival |
| 2012/0008344 | A1 | 1/2012 | Zeng et al. |
| 2012/0206171 | A1 | 8/2012 | Kimura et al. |
| 2013/0293268 | A1 | 11/2013 | Draxelmayr et al. |
| 2016/0181004 | A1 | 6/2016 | Li et al. |
| 2020/0218302 | A1 * | 7/2020 | Brule .................... G05F 3/30 |
| 2021/0376822 | A1 | 12/2021 | Thompson et al. |
| 2022/0116036 | A1 | 4/2022 | Rinne et al. |
| 2022/0224323 | A1 * | 7/2022 | Sievers ............... H02H 3/08 |
| 2023/0361673 | A1 * | 11/2023 | Takobe ............ H02M 1/088 |
| 2024/0019885 | A1 * | 1/2024 | Ragonese ........ H03K 17/0822 |
| 2024/0274212 | A1 * | 8/2024 | Kim .................... G11C 7/04 |
| 2024/0283441 | A1 * | 8/2024 | Xing ............... H03K 17/0822 |

FOREIGN PATENT DOCUMENTS

| | | |
|---|---|---|
| GB | 2 250 383 A | 6/1992 |
| GB | 2 341 288 A | 3/2000 |
| JP | H 01-300617 A | 12/1989 |
| JP | 2001-167941 A | 6/2001 |
| JP | 2003-234234 A | 8/2003 |
| JP | 2008-072021 A | 3/2008 |
| WO | WO 93/21690 | 10/1993 |
| WO | WO 95/12247 | 5/1995 |
| WO | WO 2009/008739 A1 | 1/2009 |
| WO | WO 2010/061281 A2 | 6/2010 |
| WO | WO 2011/137845 A1 | 11/2011 |
| WO | WO 2021/211920 A1 | 10/2021 |

OTHER PUBLICATIONS

U.S. Appl. No. 18/297,034, filed Apr. 7, 2023, Torti.

U.S. Appl. No. 18/303,740, filed Apr. 20, 2023, Horan et al.

U.S. Appl. No. 18/321,859, filed May 23, 2023, Horan et al.

Analog Devices, "Single-/Dual-Supply, High Voltage Isolated IGBT Gate Driver with Miller Clamp," ADuM4135 Data Sheet, Rev. E; Jan. 2015; 17 Pages.

Bourgeois, "An Isolated Gate Drive for Power MOSFETs and IGBTs," Application Note, AN461/0194; STMicroelectronics Group; Jan. 1999; 7 Pages.

Silicon Labs, "Si827x Data Sheet;" Preliminary Rev. 0.5; Silicon Laboratories Inc.; Jan. 2016; 43 Pages.

* cited by examiner

DESATURATION CIRCUIT HAVING TEMPERATURE COMPENSATION

BACKGROUND

As is known in the art, switching devices, such as MOSFETs, can be used as load switches. During operation, the temperature of the load switch may rise due to high current flows, which changes operating characteristics of the device. Due to these changes, other circuit characteristics, such as thresholds, may be impacted.

SUMMARY

Example embodiments of the disclosure provide methods and apparatus for a desaturation (desat) circuit having temperature compensation. A desat circuit monitors the voltage from drain to source of a power MOSFET in a power stage circuit. If the current flowing through the MOSFET exceeds a certain value, an excessive voltage drop is created across the MOSFET that triggers a turn off of the power MOSFET. A trip voltage threshold for a given voltage drop may be a constant value. In embodiments, the desat circuit includes temperature compensation so that a trip voltage threshold which changes with temperature to allow the trip voltage to change with the RDSon of the MOSFET. With this arrangement, the tripping point for the MOSFET is maintained at a constant current level. It will be appreciated that setting a constant current level may be desirable in some applications to set a power dissipation limit for the system.

In one aspect, a system comprises: a desaturation circuit configured to generate a temperature-compensated voltage desaturation threshold voltage for a transistor, wherein the desaturation circuit comprises: a proportional to absolute temperature (PTAT) circuit having a bandgap circuit, wherein the PTAT circuit has an output; a complementary to absolute temperature (CTAT) circuit having an output; and a combiner circuit to combine the output of the CTAT circuit and the output of the PTAT circuit to generate the temperature-compensated voltage desaturation threshold voltage.

A system can further include one or more of the following features: the PTAT circuit comprises a first current mirror to generate a first mirror current, the first current mirror is coupled to the bandgap circuit, the CTAT circuit comprises a second current mirror to generate a second mirror current, the CTAT circuit includes a current source coupled to a diode to generate a CTAT current, the first current mirror comprises PTAT devices coupled to respective PTAT switches to selectively enable current through the PTAT devices, the PTAT devices are configured to flow a given proportion of the first mirror current, the given proportions of the first mirror current correspond to multiples of two, the second current mirror comprises CTAT devices coupled to respective CTAT switches to selectively enable current through the CTAT devices, the CTAT devices are configured to flow a given proportion of the second mirror current, the given proportions of the second mirror current correspond to multiples of two, the output of the CTAT circuit and the output of the PTAT circuit are controlled to tune a temperature coefficient of the voltage desaturation threshold voltage based on a temperature profile of the MOSFET, and/or a current clamp limit sets the voltage desaturation threshold voltage.

In another aspect, a method comprises: configuring a desaturation circuit to generate a temperature-compensated voltage desaturation threshold voltage for a transistor, wherein the desaturation circuit comprises: a proportional to absolute temperature (PTAT) circuit having a bandgap circuit, wherein the PTAT circuit has an output; a complementary to absolute temperature (CTAT) circuit having an output; and a combiner circuit to combine the output of the CTAT circuit and the output of the PTAT circuit to generate the temperature-compensated voltage desaturation threshold voltage.

A method can further include one or more of the following features: the PTAT circuit comprises a first current mirror to generate a first mirror current, the first current mirror is coupled to the bandgap circuit, the CTAT circuit comprises a second current mirror to generate a second mirror current, the CTAT circuit includes a current source coupled to a diode to generate a CTAT current, the first current mirror comprises PTAT devices coupled to respective PTAT switches to selectively enable current through the PTAT devices, the PTAT devices are configured to flow a given proportion of the first mirror current, the given proportions of the first mirror current correspond to multiples of two, the second current mirror comprises CTAT devices coupled to respective CTAT switches to selectively enable current through the CTAT devices, the CTAT devices are configured to flow a given proportion of the second mirror current, the given proportions of the second mirror current correspond to multiples of two, the output of the CTAT circuit and the output of the PTAT circuit are controlled to tune a temperature coefficient of the voltage desaturation threshold voltage based on a temperature profile of the MOSFET, and/or a current clamp limit sets the voltage desaturation threshold voltage.

BRIEF DESCRIPTION OF THE DRAWINGS

The foregoing features of this invention, as well as the invention itself, may be more fully understood from the following description of the drawings in which.

DETAILED DESCRIPTION

Figure 1:
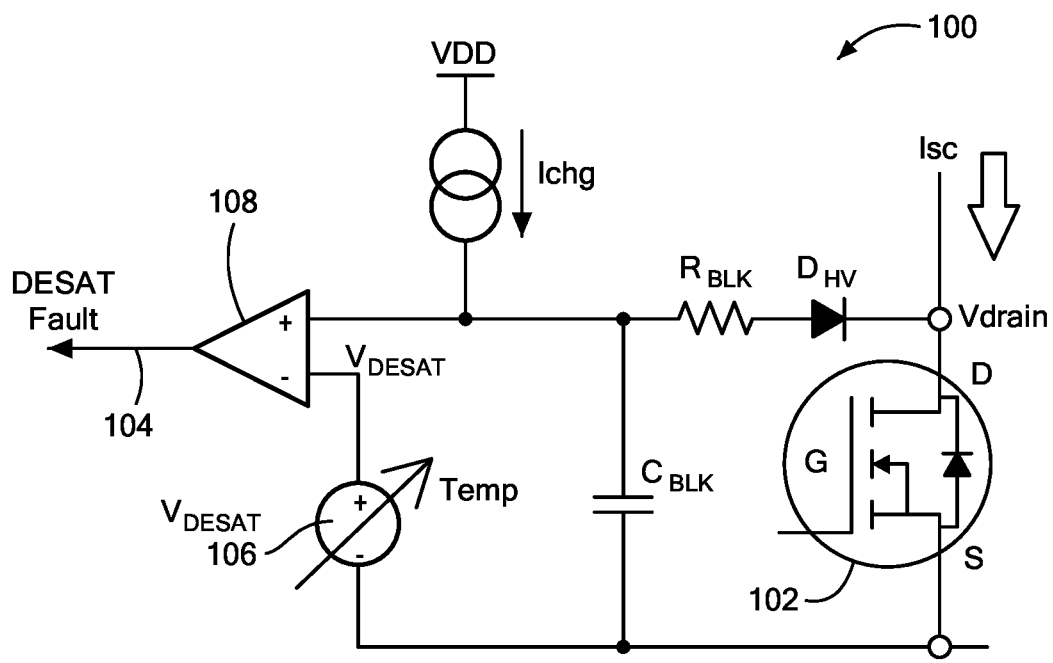
FIG. 1 shows a desat protection circuit having temperature compensation in accordance with example embodiments of the disclosure.

FIG. 1 shows a desat protection circuit 100 having voltage threshold temperature compensation in accordance with example embodiments of the disclosure. The circuit 100 operates to limit the amount of current flowing in a MOSFET 102 by monitoring voltage Vdrain on the drain D of the MOSFET. In the event that the drain voltage Vdrain exceeds a defined level for a defined time, a fault signal 104 can be sent to a control unit (not shown), which may turn off the MOSFET 102 and/or take some protective action.

A fault may be caused by a sudden increase in current Isc, which causes an increase in voltage Vdrain. A sudden increase in current Isc may be generated by a short circuit, for example. This turns off a high voltage diode $D_{HV}$ so that a blocking capacitor $C_{BLK}$ charges up by charging current Ichg. After a time, which depends on the level of charging current Ichg and the capacitance of $C_{BLK}$, the voltage on capacitor $C_{BLK}$ reaches a threshold voltage VDESAT defined by a desat threshold circuit 106, which trips a comparator 108, for example, and generates a fault.

In example embodiments, the desat threshold circuit 106 provides temperature dependence to the threshold voltage VDESAT by using a proportional to absolute temperature (PTAT) current from a bandgap circuit flowing into a resistor to produce a positive voltage change with temperature. A complementary to absolute temperature (CTAT) circuit that uses a forward diode voltage, for example, which typically changes with −2 mV per degree C., can be proportionally combined with the PTAT current to achieve a given variation of VDESAT with temperature to compensate for the change in RDSon of the MOSFET.

While example embodiments of the disclosure are shown in described in conjunction with a FET, it is understood that embodiments can include any type of transistor, switch, and the like, having resistance characteristics that change over temperature.

In general, in an ideal circuit, a load switch, such as a MOSFET, has no impedance when the device is on. In practice, the totality of resistive components of the load switch, e.g., inherent resistance from silicon process, bond wire resistance, and resistance of the lead frame, is referred to as On-resistance ($R_{ON}$) and is an important parameter when selecting a load switch. On-resistance is defined as the total measured resistance from the VIN to VOUT pins of the load switch. As load current passes through the device, this resistance causes a voltage drop in the power path. The resistance from the FET component is often separated from the total silicon resistance into a parameter referred to as $R_{DSON}$, which is typically the largest source of resistance in a load switch.

As power is dissipated through the load switch, the device junction temperature increases which changes the operating characteristics of the device. When the gate voltage is less than the threshold voltage, there is no drain current. Once the gate voltage is greater than the threshold voltage, the current increases linearly with gate voltage so that a MOSFET operating in the linear region can be described as a voltage controlled resistor. Thus, current does not directly affect $R_{DSON}$. Load current can indirectly effect $R_{DSON}$ in cases of high power dissipation which raises the junction temperature of the device.

Figure 2:
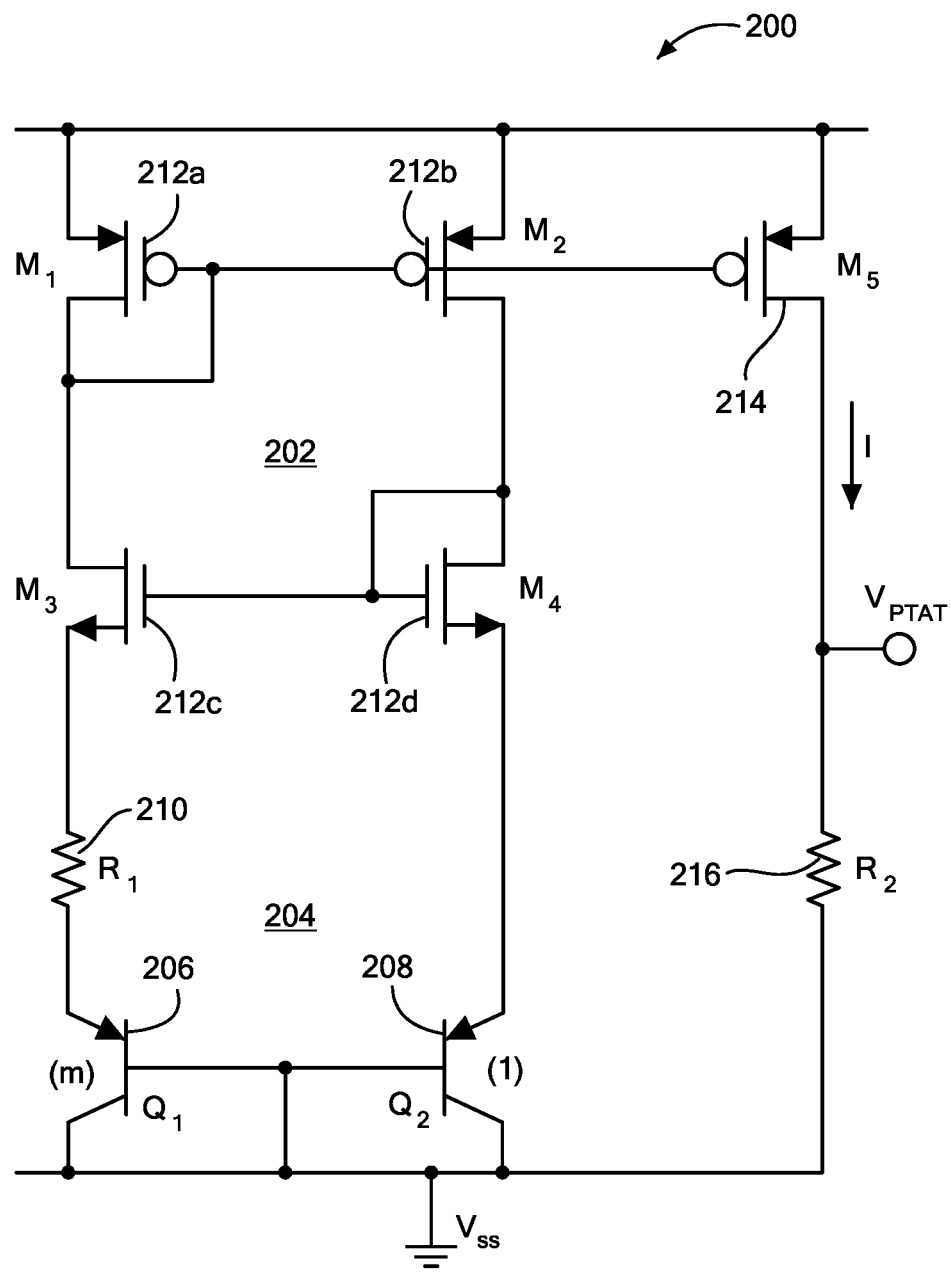
FIG. 2 is a circuit diagram of an example PTAT circuit.

FIG. 2 shows an example PTAT circuit 200 that includes a current mirror circuit 202 coupled to a bandgap circuit 204. The bandgap circuit 204 includes common collector transistors 206, 208 and a resistor 210. The current mirror circuit 202 includes devices 212a,d coupled in a current mirror configuration. A transistor 214 coupled to the current mirror 202 generates a first mirror current that flows through a resistor 216 that generates a PTAT voltage $V_{PTAT}$.

As is known in the art, a bandgap voltage reference provides a temperature independent voltage level, typically around 1.25V, that is fixed at a given level in the presence of variations, such as temperature changes, loading, power supply variation, etc.

Figure 3:
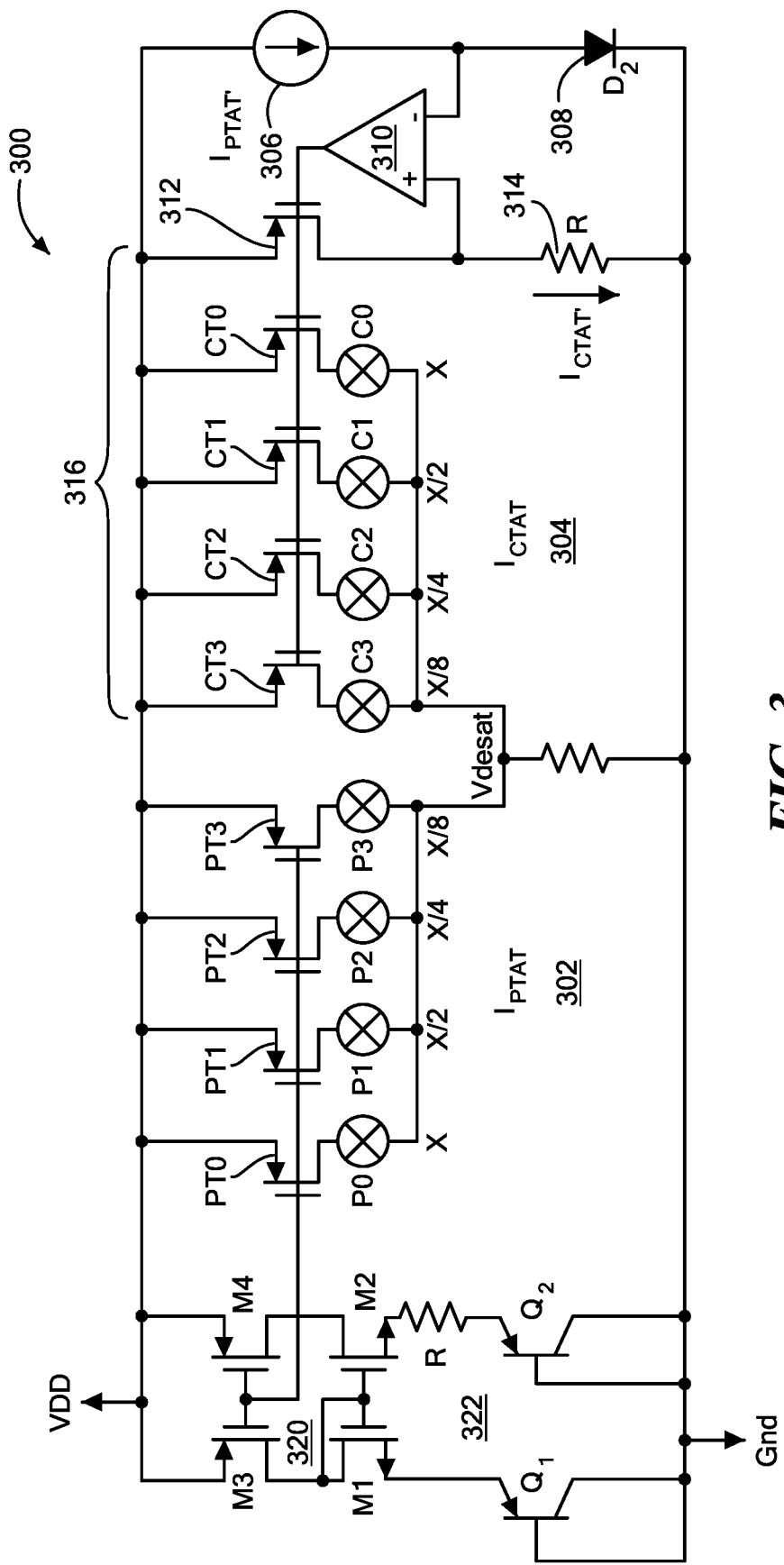
FIG. 3 is a circuit diagram of an example desaturation voltage implementation having controlled PTAT and CTAT currents for temperature compensation.

FIG. 3 shows an example circuit for providing temperature independence to the threshold voltage VDESAT of FIG. 1. In the illustrated embodiment, a desat circuit 300 includes a PTAT circuit 302 and a CTAT circuit 304. The CTAT circuit 304 directs current from a current source 306 into a diode 308. The voltage across the diode 308 provides a CTAT voltage, which is input to an amplifier 310. The amplifier 310 mirrors the voltage across the diode to the resistor 304 by adjusting the gate of transistor 312. As a consequence, the current in the resistor is CTAT. The current in the resistor flows in the transistor 312 and this CTAT current is mirrored to transistors CT0-4.

The PTAT circuit 302 may be similar to the PTAT circuit 200 of FIG. 2 with the addition of one or more switches having selected ratios. In the illustrated embodiment, the PTAT circuit 302 includes a bandgap reference circuit 322 and a current mirror circuit 320 that may be similar to the PTAT circuit of FIG. 2.

In the illustrated embodiment, sets of respective switches form part of the PTAT and CTAT current mirrors to define how much current from each circuit is used to tune the temperature coefficient of the threshold voltage VDESAT. A first set of switches P0-P3 are coupled to respective PTAT mirror transistors PT0-3 that can selectively turn off and on current flow. In the example embodiment, P0 controls 1× the PTAT mirror current, P1 carries one-half the mirror current, P2 carries one-fourth of the mirror current, and P3 carries one-eighth the mirror current. Thus, the maximum PTAT current is 1 and ⅞ times the mirror current and the minimum current is ⅛ of the mirror current. Any combination of activated switches P0-P3 can be used to select a current level for the selected VDESAT threshold voltage.

Similarly, a second set of switches C0-C3 for the CTAT current is coupled to respective CTAT mirror transistors CT0-3 that can selectively turn off and on current flow. In the example embodiment, C0 carries 1× the CTAT mirror current, C1 carries one-half the mirror current, C2 carries one-fourth of the mirror current, and C3 carries one-eighth the mirror current.

By controlling the first and second sets of switches, the voltage threshold VDESAT is defined by weighting of the PTAT and CTAT voltages.

It is understood that any practical number of switches and mirror devices for PTAT and CTAT circuit can be used to meet the needs of a particular application. For example, increased voltage resolution may require additional switches and mirror devices.

In some embodiments, a zero change to absolute temperature (ZTAT) current sink may be used for temperature independence. For example, a ZTAT circuit can be used for VDESAT temperature coefficient tuning by adjusting a capacitor charging current to a desired value by using a band gap circuit.

The Ron of the power MOSFET or SIC device for a given temperature, say 25 degrees, is given by the equation:

$$Ron_{MOSFET}(Temp) = Ron_{25} + \beta \cdot (Temp-25)$$

If one sets a current clamp limit of $I_{clamp}$ then the clamping threshold for Vdesat as a function of temperature will be given by:

$$Vdesat(Temp) = I_{clamp} * (Ron_{25} + \beta \cdot (Temp-25))$$

which can be rewritten as:

$$Vdesat(Temp) = I_{clamp} * Ron_{25} + \beta \cdot I_{clamp} \cdot (Temp-25)$$

which can be rewritten as:

$$Vdesat(Temp) = Vdesat_{25} * \beta \cdot I_{clamp} \cdot (Temp-25)$$

Thus, Vdesat(Temp) has a voltage of $Vdesat_{25}$ at 25 degrees which is computed from=$I_{clamp}*Ron_{25}$ and has a temperature coefficient of $\beta I_{clamp}$. It is understood that temperature coefficient $\beta$ is an operating parameter for a given device typically found from a device datasheet and $I_{clamp}$ is a system defined parameter, which may be set by the user.

Figure 4:
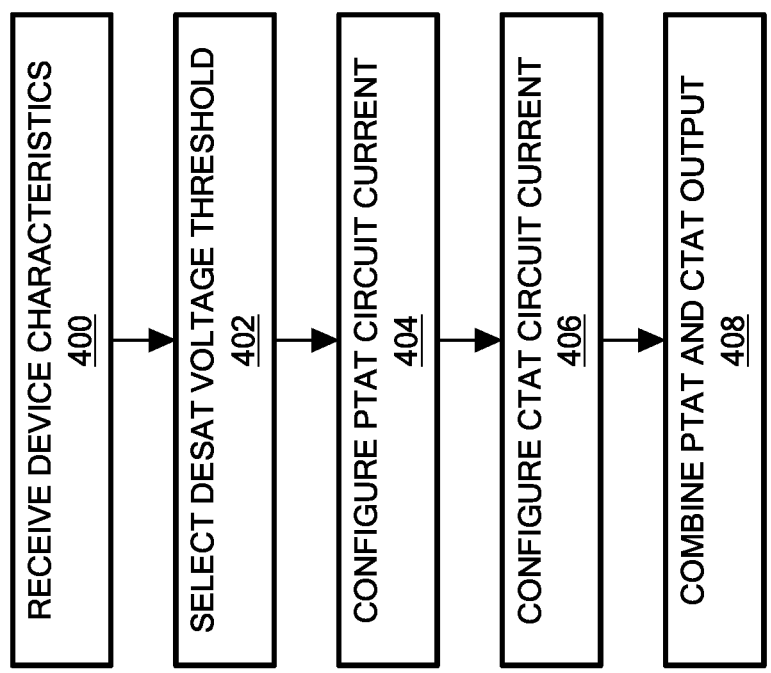
FIG. 4 is a flow diagram of an example sequence of steps for providing desaturation voltage with controlled PTAT and CTAT currents for temperature compensation.

FIG. 4 shows an example sequence of steps for providing a temperature compensated desaturation voltage in accordance with example embodiments of the disclosure. In step 400, operating characteristics for a FET are received. In step 402, a desat voltage is selected for the FET. In step 404, a current level for a PTAT circuit is set based on temperature characteristics of the FET. In step 406, a current level for a CTAT circuit is set based on temperature characteristics of the FET. In step 408, currents from the PTAT circuit and the CTAT circuit are combined to generate the desaturation voltage threshold.

Figure 5:
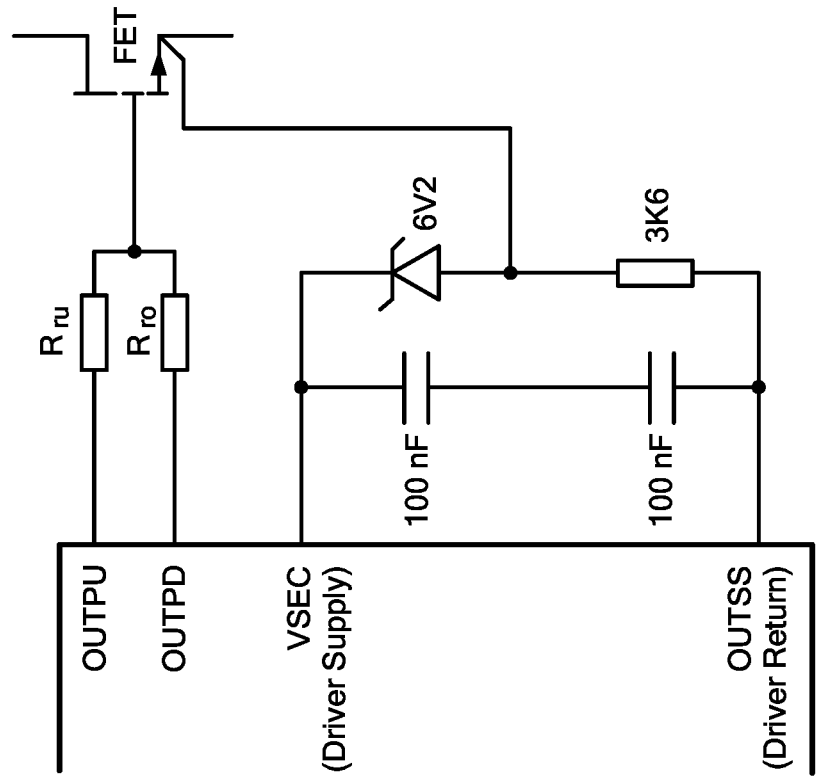
FIG. 5 is a schematic representation of an example gate driver IC that can provide a temperature compensated desaturation voltage threshold for a FET.
Figure 6:
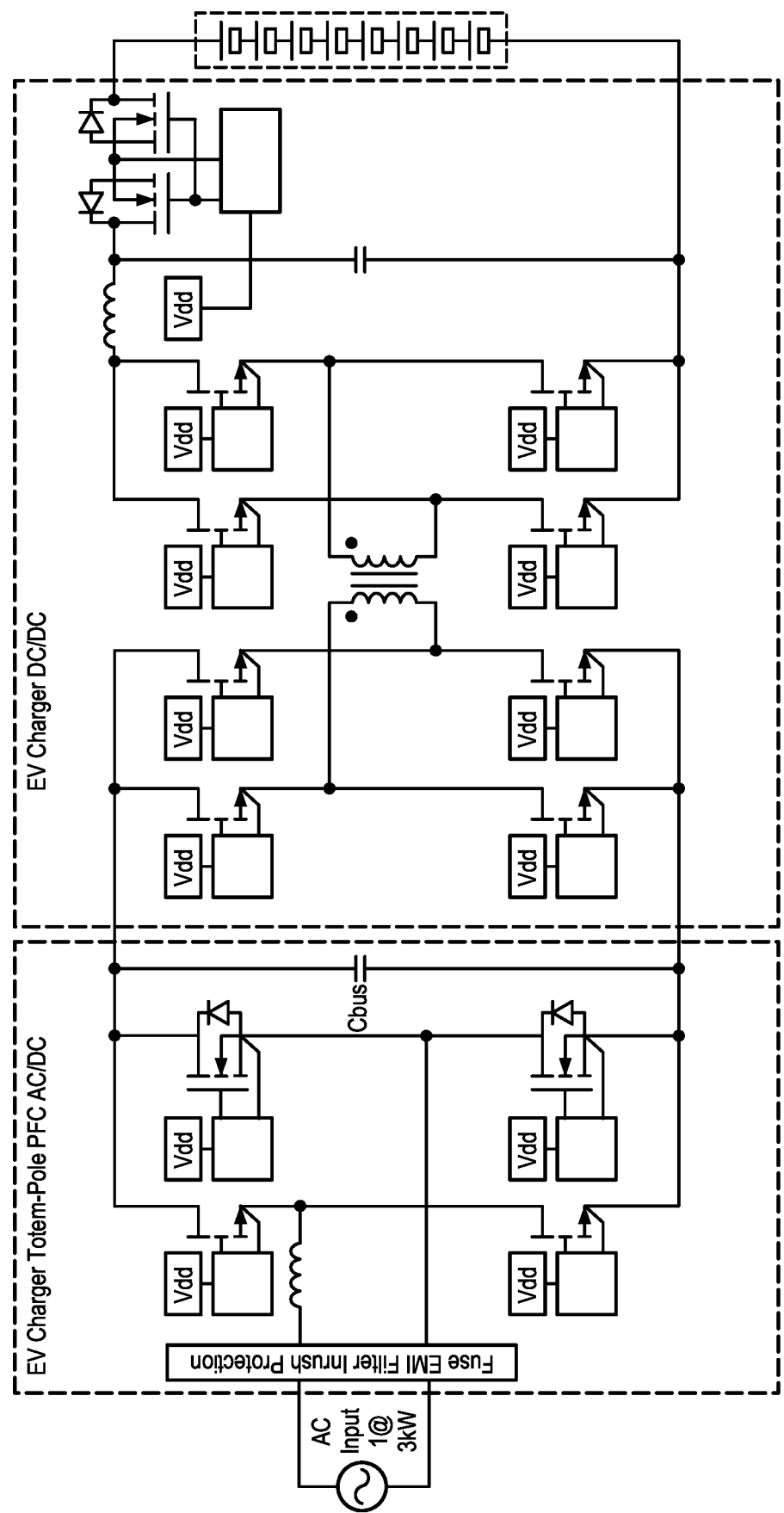
FIG. 6 is a schematic representation of an example EV charger circuit that can provide temperature compensated desaturation voltage thresholds.

It is understood that embodiments of the disclosure are applicable to a wide range of applications in which temperature-compensated FET protection is desirable, such as motor drivers, switch controllers, rectifiers, converters, inverters and the like. FIG. 5 shows an example FET coupled to a gate driver IC providing pull up OUTPU and pull down OUTPD signals for controlling the FET. The gate drive can include a temperature-compensated desaturation voltage threshold. FIG. 6 shows an example charger circuit for an electric vehicle that drives GaN FETs that can include temperature-compensated desaturation voltage thresholds.

Having described exemplary embodiments of the invention, it will now become apparent to one of ordinary skill in the art that other embodiments incorporating their concepts may also be used. The embodiments contained herein should not be limited to the disclosed embodiments but rather should be limited only by the spirit and scope of the appended claims. All publications and references cited herein are expressly incorporated herein by reference in their entirety.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. A system, comprising:
   a desaturation circuit configured to generate a temperature-compensated voltage desaturation threshold voltage for a transistor, wherein the desaturation circuit comprises:
   a proportional to absolute temperature (PTAT) circuit having a bandgap circuit, wherein the PTAT circuit has an output;
   a complementary to absolute temperature (CTAT) circuit having an output; and
   a combiner circuit to combine the output of the CTAT circuit and the output of the PTAT circuit to generate the temperature-compensated voltage desaturation threshold voltage.

2. The system according to claim 1, wherein the PTAT circuit comprises a first current mirror to generate a first mirror current.

3. The system according to claim 2, wherein the first current mirror is coupled to the bandgap circuit.

4. The system according to claim 2, wherein the CTAT circuit comprises a second current mirror to generate a second mirror current.

5. The system according to claim 4, wherein the CTAT circuit includes a current source coupled to a diode to generate a CTAT current.

6. The system according to claim 4, wherein the first current mirror comprises PTAT devices coupled to respective PTAT switches to selectively enable current through the PTAT devices.

7. The system according to claim 6, wherein the PTAT devices are configured to flow a given proportion of the first mirror current.

8. The system according to claim 7, wherein the given proportion of the first mirror current corresponds to multiples of two.

9. The system according to claim 4, wherein the second current mirror comprises CTAT devices coupled to respective CTAT switches to selectively enable current through the CTAT devices.

10. The system according to claim 9, wherein the CTAT devices are configured to flow a given proportion of the second mirror current.

11. The system according to claim 10, wherein the given proportion of the second mirror current corresponds to multiples of two.

12. The system according to claim 4, wherein the output of the CTAT circuit and the output of the PTAT circuit are controlled to tune a temperature coefficient of the voltage desaturation threshold voltage based on a temperature profile of the transistor.

13. The system according to claim 1, wherein a current clamp limit sets the voltage desaturation threshold voltage.

14. A method, comprising:
   configuring a desaturation circuit to generate a temperature-compensated voltage desaturation threshold voltage for a transistor, wherein the desaturation circuit comprises:
   a proportional to absolute temperature (PTAT) circuit having a bandgap circuit, wherein the PTAT circuit has an output;
   a complementary to absolute temperature (CTAT) circuit having an output; and
   a combiner circuit to combine the output of the CTAT circuit and the output of the PTAT circuit to generate the temperature-compensated voltage desaturation threshold voltage.

15. The method according to claim 14, wherein the PTAT circuit comprises a first current mirror to generate a first mirror current.

16. The method according to claim 15, wherein the first current mirror is coupled to the bandgap circuit.

17. The method according to claim 15, wherein the CTAT circuit comprises a second current mirror to generate a second mirror current.

18. The method according to claim 17, wherein the CTAT circuit includes a current source coupled to a diode to generate a CTAT current.

19. The method according to claim 17, wherein the first current mirror comprises PTAT devices coupled to respective PTAT switches to selectively enable current through the PTAT devices.

20. The method according to claim 19, wherein the PTAT devices are configured to flow a given proportion of the first mirror current.

21. The method according to claim 20, wherein the given proportion of the first mirror current corresponds to multiples of two.

22. The method according to claim 17, wherein the second current mirror comprises CTAT devices coupled to respective CTAT switches to selectively enable current through the CTAT devices.

23. The method according to claim 22, wherein the CTAT devices are configured to flow a given proportion of the second mirror current.

24. The method according to claim 23, wherein the given proportion of the second mirror current corresponds to multiples of two.

25. The method according to claim 17, wherein the output of the CTAT circuit and the output of the PTAT circuit are controlled to tune a temperature coefficient of the voltage desaturation threshold voltage based on a temperature profile of the transistor.

26. The method according to claim 14, wherein a current clamp limit sets the voltage desaturation threshold voltage.

27. A system, comprising:
a desaturation circuit configured to generate a temperature-compensated voltage desaturation threshold voltage for a transistor, wherein the desaturation circuit comprises:

a proportional to absolute temperature (PTAT) circuit having a bandgap circuit, wherein the PTAT circuit has an output, wherein the PTAT circuit comprises a series of current mirrors each having an associated weight;

a complementary to absolute temperature (CTAT) circuit having an output, wherein the CTAT circuit comprises a series of current mirrors each having an associated weight; and a combiner circuit to combine the output of the CTAT circuit and the output of the PTAT circuit to generate the temperature-compensated voltage desaturation threshold voltage, wherein first ones of the PTAT circuit current mirrors and first ones of the CTAT current mirrors are activated to maintain the temperature-compensated voltage desaturation threshold voltage over temperature based on temperature characteristics of the transistor.

28. The system according to claim 27, wherein the associated weights of the PTAT circuit current mirrors comprise $1/2^n$ of the PTAT current, where n is an integer.

29. The system according to claim 27, wherein the associated weights of the CTAT circuit current mirrors comprise $1/2^n$ of the CTAT current, where n is an integer.

* * * * *

UNITED STATES PATENT AND TRADEMARK OFFICE
CERTIFICATE OF CORRECTION

PATENT NO. : 12,267,071 B2
APPLICATION NO. : 18/327292
DATED : April 1, 2025
INVENTOR(S) : John Horan et al.

Page 1 of 1

It is certified that error appears in the above-identified patent and that said Letters Patent is hereby corrected as shown below:

In the Specification

Column 1, Line 26, delete "RDSon" and replace with --$R_{DSON}$--.

Column 3, Line 18, delete "RDSon" and replace with --$R_{DSON}$--.

Column 3, Line 53, delete "212a,d" and replace with --212a-d--.

Column 4, Line 3, delete "resistor 304" and replace with --circuit 304--.

Column 4, Line 6, delete "CTO-4." and replace with --CTO-CT3.--.

Column 4, Line 17, delete "PTO-3" and replace with --PTO-PT3--.

Column 4, Line 28, delete "CTO-3" and replace with --CTO-CT3--.

Column 5, Line 4, delete "Vdesat$_{25}$ * β…" and replace with --Vdesat$_{25}$ + β…--.

Signed and Sealed this
Fourteenth Day of October, 2025

John A. Squires
*Director of the United States Patent and Trademark Office*